United States Patent [19]
Jones et al.

[11] Patent Number: 5,943,204
[45] Date of Patent: Aug. 24, 1999

[54] ELECTRONIC TRIP UNIT WITH DEDICATED OVERRIDE CURRENT SENSOR

[75] Inventors: William John Jones, Cranberry Township; Richard Arthur Johnson, Aliquippa, both of Pa.

[73] Assignee: Eaton Coroporation, Cleveland, Ohio

[21] Appl. No.: 09/005,816

[22] Filed: Jan. 12, 1998

[51] Int. Cl.⁶ .................................................. H02H 3/00
[52] U.S. Cl. ............................. 361/93; 361/96; 361/115
[58] Field of Search .................................. 361/42, 93, 96, 361/98, 100, 115, 23, 24, 25

[56] References Cited

U.S. PATENT DOCUMENTS

| | | | |
|---|---|---|---|
| 5,276,416 | 1/1994 | Ozaki | 361/42 |
| 5,369,542 | 11/1994 | Leone et al. | 361/94 |
| 5,650,907 | 7/1997 | Ishii et al. | 361/93 |

*Primary Examiner*—Jeffrey Gaffin
*Assistant Examiner*—Stephen Jackson
*Attorney, Agent, or Firm*—Martin J. Moran

[57] ABSTRACT

An electronic trip unit for a circuit breaker having two current sensors per phase, wherein the first magnetic core current transformer is designed to monitor current in the normal and overcurrent range, and the second low-permeability core sensor is designed to produce an override trip signal at or below the short time withstand current rating of the circuit breaker. In a second embodiment the electronic trip unit includes only the low-permeability core sensor that has negligible output in the normal current range.

22 Claims, 4 Drawing Sheets

5,943,204

ELECTRONIC TRIP UNIT WITH DEDICATED OVERRIDE CURRENT SENSOR

This invention was conceived under Government Contract Number N61331-94-C-0078

FIELD OF THE INVENTION

This invention relates in general to electronic trip units and more particularly, to trip units that benefit from a time withstand current rating and an override trip rating.

BACKGROUND OF THE INVENTION

The most important application feature that distinguishes a power circuit breaker from a molded case circuit breaker is the ability of the power circuit breaker to tolerate very high over current levels without tripping. The maximum current level that a power circuit breaker can tolerate for a short time period without internal damage is called its short time withstand current rating; generally, short time current ratings for 0.5, 1.0 and 3.0 seconds are established. The short time withstand current rating identifies the mechanical and thermal ability of the breaker to withstand overcurrents for the given period of time and is specified as a characteristic of the breaker independent of the current levels at which the trip functions are actuated. Power circuit breakers are typically used in radial distribution systems to feed a load center, motor control center or panel boards. A multiplicity of circuit breakers in these load centers then feed a variety of individual loads. To coordinate the tripping characteristics of the power circuit breaker with these downstream breakers, it is very desirable to design the mechanical characteristics of the breaker so its "withstand current" level is as high as possible, preferably equal to the available fault current from the source of supply.

If power circuit breakers are applied within the limits of their short time current rating, they are generally applied without an instantaneous trip feature. They can tolerate any available fault current for that short time and give the downstream circuit breakers an ample opportunity to clear any fault that may develop on one of the load lines. Only if the fault is located immediately downstream (with no intervening circuit breaker) should the power circuit breaker ultimately trip open. For any other fault location, the power circuit breaker should stay closed. Thus, continuity of service is preserved for all of the feeder loads that are not directly involved with the fault. This feature, where only the circuit breaker immediately upstream from any fault opens, is called "selective coordination" or "selectivity."

For many modern power circuit breakers it is common to find that the rated interrupting capacity of the power circuit breaker will exceed its short time withstand rating by a considerable margin. For example, a power circuit breaker may have an interrupting capacity rating at 480 vac of 100,000 amps, but a withstand current rating of only 65,000 amps. It is not uncommon, therefore, to find power circuit breakers applied in systems in which the available fault current can greatly exceed the rated short time withstand current rating of the breaker (but not the interrupting capacity). In such applications, the power circuit breaker must trip without intentional delay for fault currents which exceed its "withstand" capability. This is frequently called an "override" trip feature. When using this override trip feature, total selectivity is sacrificed. To minimize the chance that the power breaker will trip unnecessarily, it is important to set the override trip current setting on the power breaker as high as is possible, preferably just below its withstand current rating.

Thus, to maximize selectivity it is desirable to design the override trip setting of the power circuit breaker at or near the withstand rating. However, many power breakers in switchboards with very high available fault currents are used as feeders with frame ratings of only a few hundred amperes. In these applications, the withstand rating of the breaker (and thus, the desirable override trip setting) may be a hundred or more times the breaker frame rating. Since the current sensors in the breakers are designed for useful accuracy and power output over its "normal" current operating range, at such high overcurrent conditions they saturate magnetically and their output is totally unpredictable. Thus with conventional magnetic core current sensors, differentiating between high and very high overcurrents is not possible. In most applications a high normal current is considered to be one that is likely to be experienced intermittently under "normal" conditions such as the inrush current during motor starting; such currents are approximately ten times the normal operating range experienced while the equipment is in a steady state. Very high currents are usually associated with shorts in the circuit and currents can rise to an order of magnitude of 100 or more times the normal operating range.

A second problem that can arise when a current transformer experiences a very high overload is that the secondary current (or power) output produced can be destructive to the electronic trip unit or to the inter-connecting wiring. It is therefore common to "protect" the trip unit from such very high overcurrents by "clamping" the signal at a safe level (such as with a Zener diode), or by designing the current sensor to saturate at modest current levels, thus limiting its output. Either of these "solutions" creates an impediment to setting the override trip setting at the desired high level needed to maximize selectivity.

The most common design approaches to this problem are to (1) lower the interruption rating of the circuit breaker to equal the withstand rating so that a high-set instantaneous trip feature is not necessary, or (2) set the override trip at a very modest level (about twenty to thirty times the frame rating) and accept the loss of selectivity that results. From an application standpoint, neither of these alternatives is desirable. If the breaker interruption rating is lowered to obviate the need for an override trip function, it forgoes its application to the "high interruption" segment of the market. If the override rating is set at a low level (20 to 30 PU) consistent with the overcurrent sensing capability of the magnetic core sensors, the breaker cannot make use of its withstand capability and thus sacrifices selectivity that is otherwise inherent in the product.

There is also a segment of the market that tends to apply circuit breakers up to their interruption rating, without regard for selectivity. A portion of this market occasionally employs power circuit breakers as simple switches requiring no overcurrent protection and thus, no overcurrent trip unit. Alternatively, they may be sold to users that prefer to provide their own overcurrent protection system. Such switches are termed non-automatic circuit breakers.

If a non-automatic circuit breaker is applied in a distribution system where the available fault current level is at or below its withstand rating, it can be used without any overcurrent protection. In this instance, the manufacturer is forced to assign a lower interruption rating to the breaker which is equal to its withstand capability. It would be advantageous to be able to sell non-automatic circuit breakers with a simple, inexpensive self-contained protection device that would trip the breaker without delay at current levels above its withstand rating. With such a protection mechanism, the manufacturer could upgrade the interruption rating of the non-automatic circuit breaker to a much higher level, consistent with its ultimate interruption rating. To provide such differentiation today, manufacturers must equip the circuit breaker with current sensors and a simplified electronic trip unit at considerable expense.

Accordingly, an improved electronic trip unit and current sensor system is desired that is capable of differentiating between high and very high currents as described above and tripping on currents approaching the withstand current rating of the circuit breaker.

SUMMARY OF THE INVENTION

An electronic trip unit constructed in accordance with this invention has an override trip function that employs a second dedicated current sensor capable of monitoring currents approaching the withstand rating of the breaker; this sensor is separate from the current sensing mechanism used to sense currents in the normal overload range. In one embodiment the current sensing mechanism used in implementing the normal overload current capability is interchangeable with similar sensors constructed to monitor different operating ranges to enable the user to select an appropriate delayed trip set point for a particular application. The normal instantaneous tripping feature can be turned off so that the tripping of the circuit breaker under high overcurrent conditions defaults to the add-on protection provided by the override current sensors and trip circuitry of this invention. The override circuit works with the normal trip unit and can utilize the capacitor-stored energy of the trip unit to operate the trip actuator.

In another embodiment for non-automatic circuit breakers, the override current sensor is used alone and its output is sufficient to power the trip circuitry and the trip mechanism when the override current rating is exceeded. The override sensor trip setting is nonadjustable but can be interchanged with similar sensors constructed to provide outputs to accommodate various current ranges to be encountered in different applications. The addition of the override current sensor and trip circuits provides the option of adding an inexpensive rapid response trip capability; increasing the overall rating; and versatility of the non-automatic circuit breaker.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENT

Figure 1:
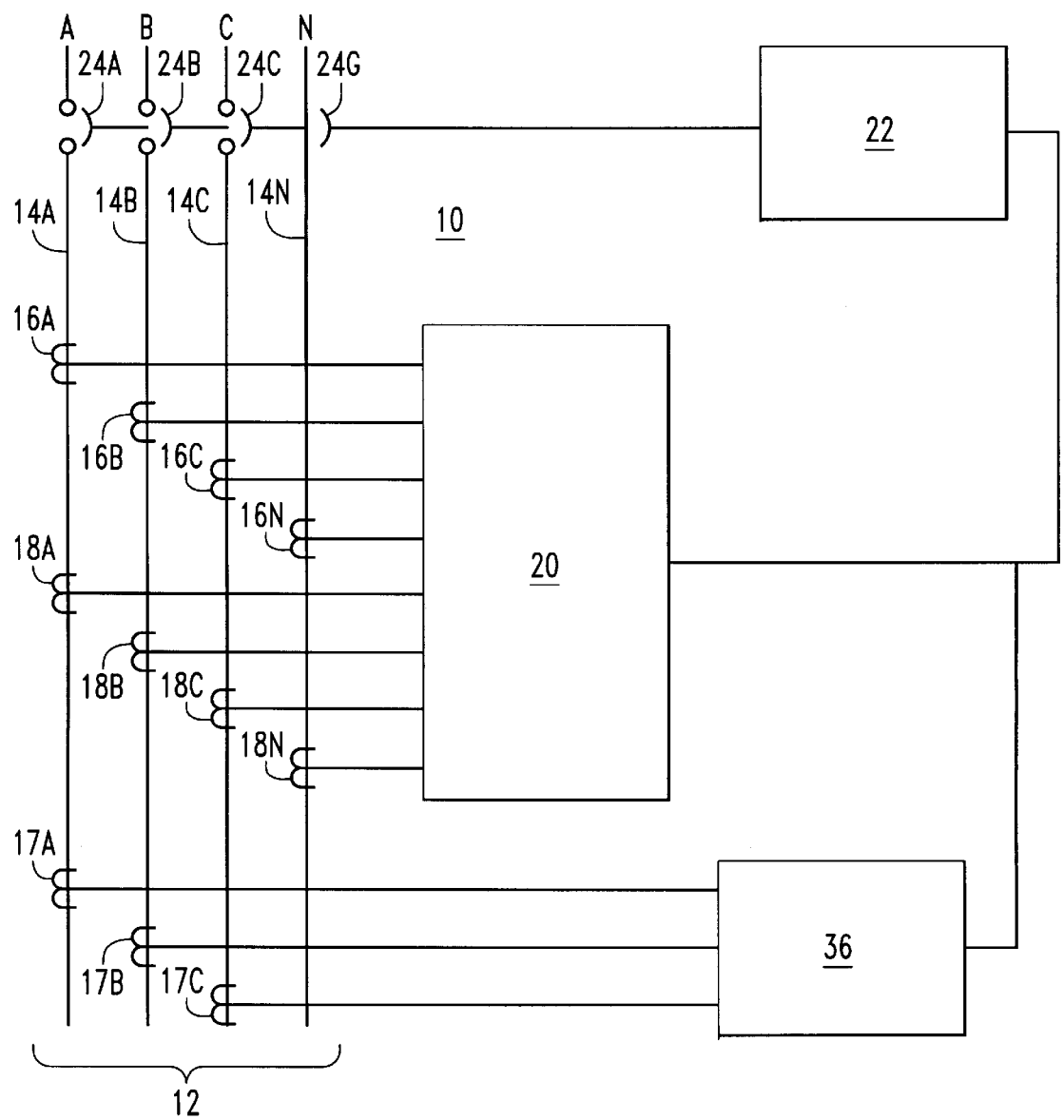
FIG. 1 is a schematic diagram, primarily in block form, illustrating a circuit interrupter configured in accordance with this invention.

FIG. 1 illustrates a circuit breaker 10 incorporating the invention used for overcurrent protection in a/c electrical power distribution system 12, which represents the load. The power distribution system 12 illustrated has three phase conductors 14A, B and C and a neutral conductor 14N. Current transformers 16A, B, C and N sense current flowing within the corresponding conductors 14 and communicate the value sensed to an electronic processing circuitry 20. Phase to neutral voltages may also be sensed from the three conductors 14 by potential transformers 18A, B and C and are communicated to the processing electronics. The electronics unit 20 normally includes a ranging circuit for scaling the current and voltage signals to a suitable range for conversion by an analog to digital converter for input to a digital processor. The analog to digital converter samples analog voltages and currents at a sampling rate determined by interrupts generated by the digital processor in a manner more particularly described in U.S. Pat. No. 5,600,527, issued Feb. 4, 1997, and the patents reference therein. The digital processor utilizes the data generated by the digital samples to provide protection functions, for example, instantaneous, short delay, and long delay protection for the electrical system 12, and in many instances also uses the samples for wave form capture and harmonic analysis for metering and display purposes.

In implementing the protection functions, the digital processor operates in a protection mode to generate a trip signal when any one of the current/time characteristics of the protection function is exceeded. This trip signal is passed by the electronics unit 20 to the trip actuator 22, which opens separable contacts 24A, B and C in the three-phase conductors 14A, B, and C of the electrical system 12. The trip actuator is typically a spring loaded solenoid whose armature is held in the latched position by a magnetic or mechanical latch and is released by a low energy pulse of current supplied from the trip circuit 20, so that the contacts 24A, B, and C open when the trip actuator 22 is operated.

As previously mentioned, in some cases the overcurrents which must be tolerated by the trip unit without tripping can be a factor of 10 or greater of the normal operating current value. However, the withstand current rating of the trip unit can be in the order of magnitude of 100 times the normal operating current value of the load. The broad current range makes it very hard for the current sensors 16 to perform metering, overload monitoring and the high level override trip function. This invention solves that problem by providing, as an option, dual element current sensors consisting of a standard magnetic-core current transformer shown as 16A, B, C, and N in FIG. 1, and override current sensors shown as 17A, B, C and G with a low permeability core. This arrangement has particular applicability to breakers having an interruption rating which substantially exceeds its withstand capability. The two sensors 16 and 17 are distinct and are installed independently on the conductors 14.

Figure 2B:
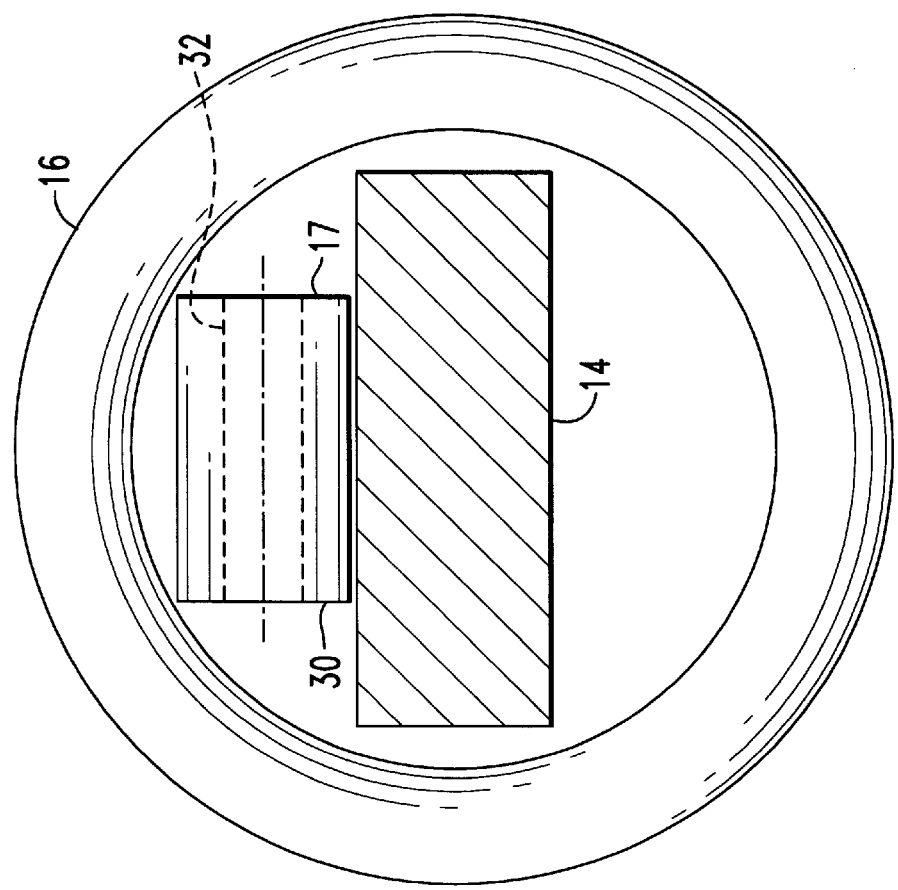
FIGS. 2A and 2B are perspective views rotated ninety degrees, partially in section, of the dual sensors of this invention applied around a phase conductor.
Figure 2A:
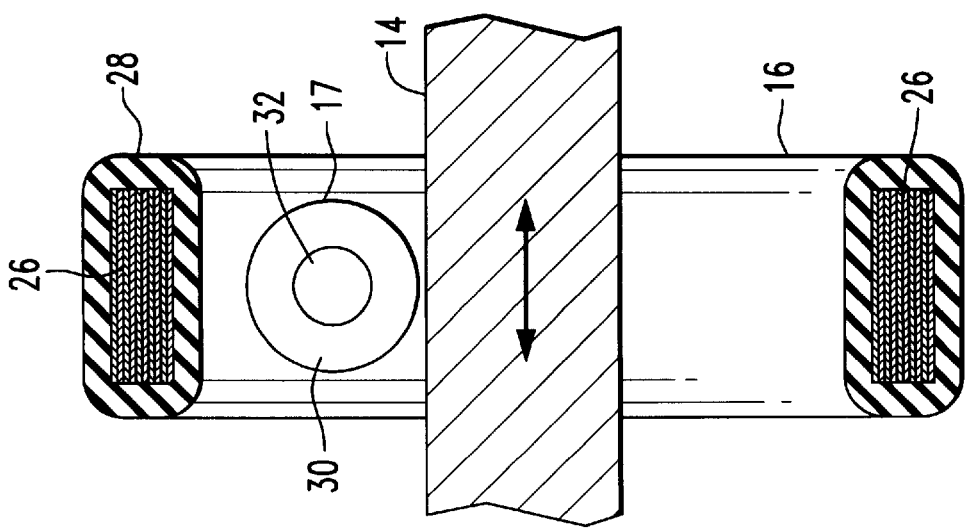

The standard current sensor 16, provided for metering and overcurrent protection, consists of a "conventional" current transformer 16 more fully shown in FIGS. 2A and 2B, with a laminated iron core 26 that surrounds each phase conductor 14. The design of the transformer 16 is optimized for measurement accuracy over a current range from about 0.1 of nominal (PU) current up to about 10 or 12 PU.

The second current sensor 17 has a low permeability core, e.g., an air core sensor, that is placed in close proximity to each of the phase conductors 14. The sensor 17 is used exclusively for the override trip function; it produces an insignificant output signal within the normal load operating range but a useful linear signal as very high current levels are reached. The electronic trip unit 20 that monitors the output of the overload sensors 17 can be the same unit that monitors the override sensors 16, or it can be a separately packaged circuit board 36 with interconnections to the main trip unit as shown in FIG. 1.

As mentioned above, the basic current sensor 16 has a laminated iron-core 26 sized for the desired power output and current measurement range. The major advantages of the iron-core current transformer are (i) it can be designed to produce a reasonable amount of power (to self-power the trip unit circuitry 20 and the trip actuator 22) at modest primary current levels, and (ii) within its useful range the accuracy is determined primarily by the number of turns on the coil(s) and is therefore quite reproducible. The current range monitored by the basic sensor 16 would extend over the anticipated normal load operating range, up to and including the delay trip current set point or pickup value and conventional instantaneous trip levels. This invention further contemplates the use of a family of such basic sensors collectively having ratings covering continuous current ranges from perhaps 200 amperes to 3,200 amperes. Each of these current sensors would be electronically "scalable" by the trip unit electronics 20 to derate the breaker nominal current rating down to perhaps 40% of its maximum sensor rating. The basic sensor can measure overcurrents up to 10 or 12 PU with a relatively linear output. The trip unit can operate in the self-powered mode with phase currents down to 10–15% of nominal sensor rating. With auxiliary power available to the trip unit, the basic sensor can measure phase current and ground fault current measurements down to near zero levels.

A basic sensor having a tape-wound core 26 with a toroidal winding 28 can be used to considerable advantage. The toroidal transformer has low exitation losses and low stray inductance, so it offers a relatively wide linear measurement range compared to traditional rectangular-core-and-coil current transformers. It also minimizes the effects of extraneous magnetic fields from adjacent phase conductors so it also offers improved accuracy in metering applications. Tape-wound cores are relatively inexpensive in high production volumes. Moreover, the size and shape of the toroidal current sensor can make more room available for the override sensor 17. In one preferred configuration, the override sensor 17 can be mounted within the semicircular space between the round current sensor 16 and the rectangular current conductor 14 shown in FIGS. 2A and 2B. Thus, the added sensor 17 is applied in a space that would not otherwise be used, and thus does not add to the size of the breaker.

The override sensor 17 has very modest requirements for accuracy and measurement range, and need not produce a significant power output at normal current levels. Therefore, a high permeability core with a distributed winding is not required. In fact, to preserve linearity at very high primary current levels, an air core sensor 17 can actually be used to advantage. An inexpensive bobbin-wound coil 30 can be placed next to the rectangular conductor 14 and calibrated for the specific conductor geometry. Its output will depend upon the magnetic field strength produced by the primary current, the air core 32 cross sectional area, and the number of turns. All of these factors can be controlled in a specific breaker geometry. The output of the sensor 17 for a practical geometry can be made to be in the range of a few volts to many tens of volts and has the advantage that its output is linear and does not saturate. Since the iron-core basic sensor 16 will fully charge the power supply capacitor in a few milliseconds under fault current conditions, a relatively low output level from the override sensor is adequate to initiate the trip function when applied as an add-on to the conventional trip unit.

Since the override sensor 17 is basically sensing the intensity of the magnetic flux field at a given point in space, it can be sensitive to conductor geometry, as well as to any adjacent phase conductors or iron structures, such as the companion overcurrent sensor 16. For any given circuit breaker, the sensor can be placed in the same position relative to the conductors so that the geometry effects will not affect unit-to-unit performance. At very high overcurrents, the adjacent iron core 26 saturates and magnetically its effect disappears. Thus, the major source of error affecting the simple magnetic field sensor is its cross sensitivity to fault currents flowing in the neighboring phases. By placing the override sensor adjacent to and midway along the long surface of the rectangular conductor (and adjacent to the 90° internal bend 34 shown in FIG. 4B) you can maximize the detector 17's sensitivity to its own phase current while minimizing its sensitivity to adjacent (neighboring) phase currents. Two dimensional magnetic flux plots were used to estimate this effect; these plots indicate that the variation in field strength at the selected sensing points when exposed to a variety of single-phase and multi-phase fault current conditions is about +/− five percent. This is more than adequate accuracy for the override sensor 17. The trip unit can be customized for different breaker frames by interchanging the sensor 17 with a corresponding sensor that would match the withstand capability and override trip rating of the application, e.g., 42 kA, 65 kA, 85kA, etc.

The metering and overcurrent protection unit 20 for the circuit interrupter shown in FIG. 1 could be of a conventional design and construction such as the CUTLER-HAMMER DIGITRIP™ series trip units manufactured by Eaton Corporation, assignee of this application. The DIGITRIP series trip units are microprocessor-based which derive their power from the associated iron core current sensors and are capable of rms sensing of up to four current channels. With the addition of a potential transformer unit, they can also calculate power, phase angle, and a variety of derived quantities. The digital trip unit can have an "instantaneous" tripping function with a selectable level from two to twelve times the selected continuous rating. This digitally-derived instantaneous trip can be designed to be relatively immune to current asymmetry (DC offset wave forms) that is commonly encountered in certain applications such as motor starting. In addition, the instantaneous trip feature can also be turned off, which is desirable for selective trip applications when using the short-time delay feature, with or without a high-set instantaneous override. The major limitation of this digital instantaneous trip function is that it involves a certain delay time (to process at least two half-cycles of current) and it has limited measurement range (because of current sensor core saturation); the latter characteristic can actually be used to advantage to protect the trip unit from high overcurrents during a fault condition.

The override trip feature in this embodiment is provided by analog circuitry that would operate on the signals from the separate override current sensor 17 inputs. These sensors produce a voltage which is proportional to the rate of change of the magnetic flux cut by the sensor coil 17, which in turn is proportional to the rate of change of the fault current in the phase conductor 14. Either the raw signal or its integral can be used for trip initiation. For sinusoidal currents of known frequency, the raw sensor 17 signal is directly proportional to the rms value of the fault current and can be compared directly to a reference value to initiate a trip signal. This technique produces a signal which is relatively unaffected by the DC offset current that is present in most three-phase faults. It also produces a signal with a minimum time delay; the rate of change of current can predict a high value of fault current before it actually develops. Alternatively, the sensor output signal can be integrated to produce a signal that is directly proportional to the primary fault current, including any DC offset present. Integration also desensitizes the signal to noise that could otherwise trigger a simple rate-of-change threshold circuit.

Figure 3:
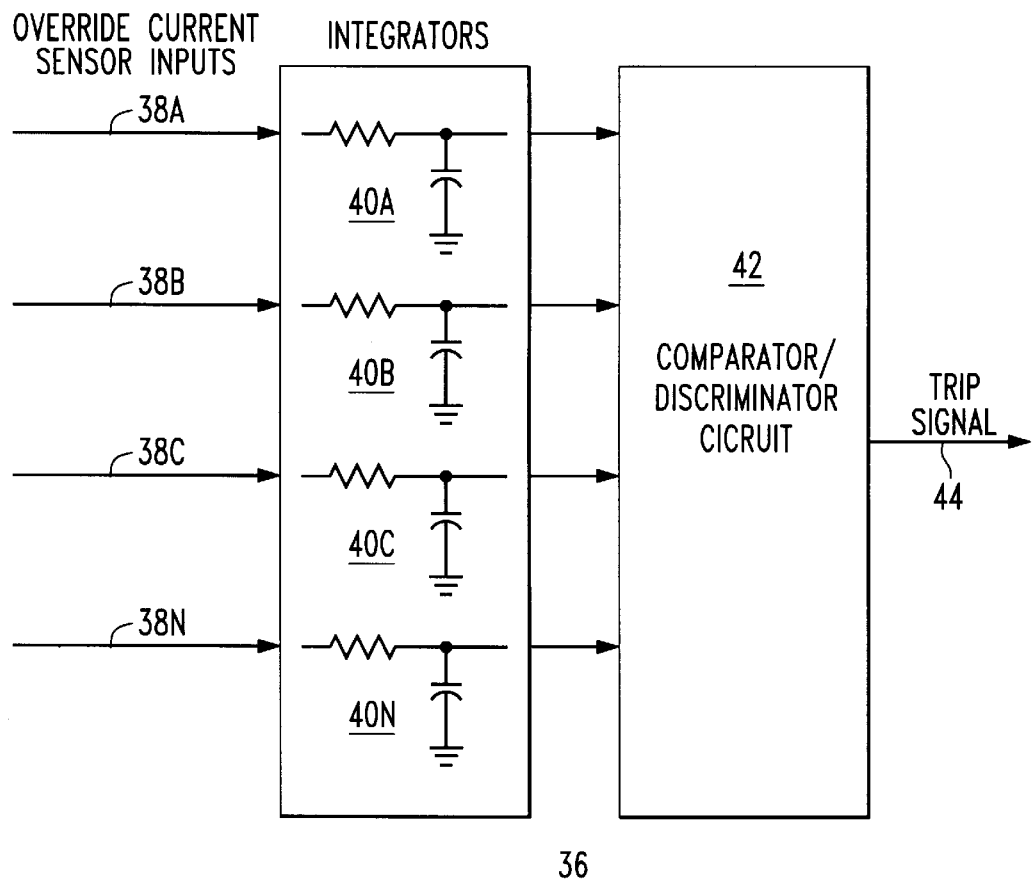
FIG. 3 is a block circuit diagram of the override trip electronics shown more generally in FIG. 1.

The short-term electrodynamic withstand capability of a circuit breaker is usually limited by the peak instantaneous current that it will tolerate without "blowing off" or damaging the main contacts. Over a somewhat longer time frame (many cycles), the withstand capability is related to the rms value of the fault current. Thus, to properly protect the circuit breaker against both short and longer term events, the actual (integrated) current would be a more useful measure. The protection circuitry can be designed to offer both types of protection. FIG. 3 shows an override circuit 36 that can be employed with this invention; each current channel 38 contains a simple resistor-capacitor "integrating circuit" 40. The resulting signals are fed to a suitable comparator circuitry 42 designed to initiate an output trip signal 44 if any one input exceeds a prescribed threshold. Normally no provision is made to adjust the override trip level and it is set just below the withstand capability of the breaker frame. However, adjustment capability could be provided if desirable.

Occasionally power circuit breakers are applied as simple switches requiring no overcurrent protection, and thus, no overcurrent trip units. Alternatively, they may be sold to users that prefer to provide their own overcurrent protection system. Such switches are termed non-automatic circuit breakers. If a non-automatic circuit breaker is supplied without overcurrent protection, its short circuit rating can be no higher than its short time withstand rating. It would be advantageous to be able to sell non-automatic breakers with a simple inexpensive internal protection device that would trip the breaker without delay at current levels above its withstand rating. With such a protection mechanism, a manufacturer can normally upgrade the interruption rating of the non-automatic breaker to a higher level, consistent with its ultimate interruption rating. Another embodiment of this invention capable of satisfying the foregoing objective of providing an inexpensive override trip capability employs a set of the current sensors, a simple analog trip unit and a trip actuator. Since the override trip system must be self-powered, the trip actuator is desirably a low energy trip device. Typically, this is a latched spring-stored-energy device that is automatically recharged each time the breaker opens, and whose stored energy is released with a small solenoid or permanent magnetic latch. Such a device is common in the industry. The principal requirements of the override current sensor are that it produce a "useful" output, both in terms of signal level and power output, that is predictably related to the override current level. The electronic trip unit can be a simple analog circuit that can examine all three phase current signals, select the highest, compare it to a reference level, and direct a tripping signal of sufficient power level to the trip actuator.

Figure 4A:
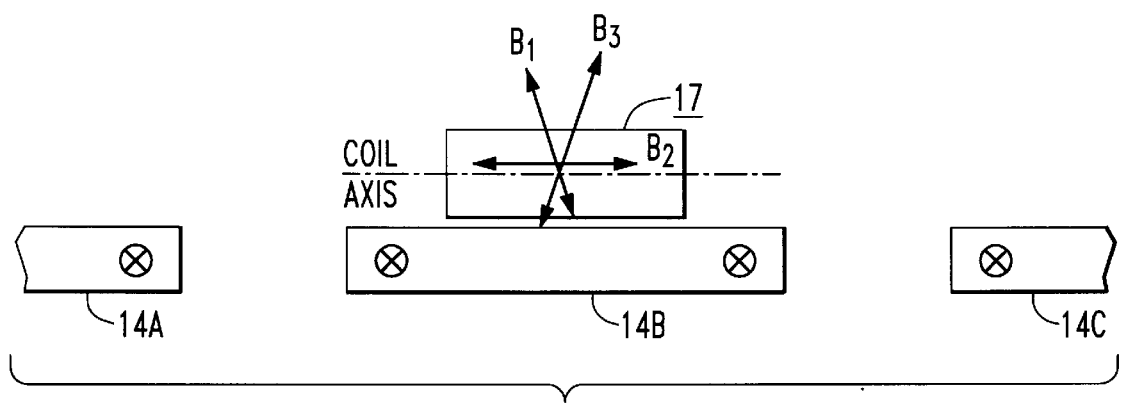
FIGS. 4A is an end view and FIG. 4B is a perspective view of the placement of the override sensor in relation to the three-phase conductors that are monitored by this invention.

The override current sensors employed for this purpose are similar to the sensors 17 previously described; simple bobbin-wound coils, which are placed near the associated phase conductor 14 so as to experience a magnetic field which is directly proportional to the current flowing in the conductor. A low permeability core material which fills the center of the coil may be used to increase the signal size somewhat so to reduce the core size or number of turns. If the axis of the override coil is placed parallel to a long side of the rectangular conductor as shown in FIG. 4A, it will experience a magnetic field intensity "B" that is principally due to the current in that conductor 14B, and only secondarily due to currents in the neighboring phase conductors 14A and 14C. To tailor the override setting to the size and withstand rating of the breaker, several models of the sensor coils differing in size or number of turns can be used.

Figure 4B:
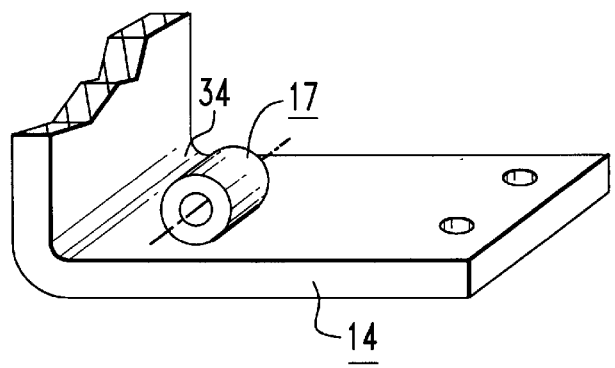

To estimate the useful voltage and power output of such a sensor, consider an aircore coil cross-sectional area of 1.0 square centimeters, sitting at an average effective radius of 5.0 centimeters, with 10,000 turns of number 38 copper wiring. Such a sensor next to a long, straight conductor would produce a voltage signal of about 60 vac, rms at a fault current of 40 kA. With a sensor internal resistance of about 800 ohms, a maximum theoretical power level in excess of one watt can be delivered into a load of similar impedance. This power level is adequate to reliably release a permanent magnetic-latched spring-stored-energy trip actuator. If greater power is needed, the bore of the sensor coil can be filled with a cylindrical iron powered core, the length of which is equal to that of the coil bobbin; this will increase the "effective" permeability of the core by a factor of two to ten and could increase the signal level or reduce the overall size and cost of the sensor at the same signal level. The output of the override sensor will also be dependent upon the path geometry of the conductor. Because the sensor will normally be located near a 90° bend in the conductor, it should preferably be located inside the bend rather than outside, as shown in FIG. 4B. This will increase its signal size considerably due to the additional flux created by the 90° conductor segment. Theoretically the flux level may double in this configuration. Actual experimental results show an increase of a factor of less than 50 percent. For any given current path geometry and location, the signal size can be calibrated, and should be repeatable from breaker to breaker.

The accuracy of the override sensor will depend upon several factors, including the number of turns, the coil cross-sectional area, the core permeability (if not air), and its location relative to the current path. If all of these factors are controlled a sensor-to-sensor repeatability of +/− five percent is attainable. The cross-sensitivity of a sensor 17 to the magnetic field of neighboring phase conductors can be minimized by its proper positioning. Flux plots of an idealized two-dimensional geometry indicate that a three-phase fault compared to a single phase fault might produce a difference in field strength at the sensor of an additional three percent. Thus, the total inaccuracies of an interchangeable override current sensor under all fault current conditions is estimated to be better than +/− ten percent. This is adequate for such a sensor. Comparable high-set instantaneous trip devices using moving armature magnets are sensitive to current peaks; as they are greatly affected by the asymmetry in the current waveform and are somewhat unpredictable in their response. Because the response of the proposed override sensor signal is quite predictable, it can avoid additional errors due to asymmetry.

Figure 5:
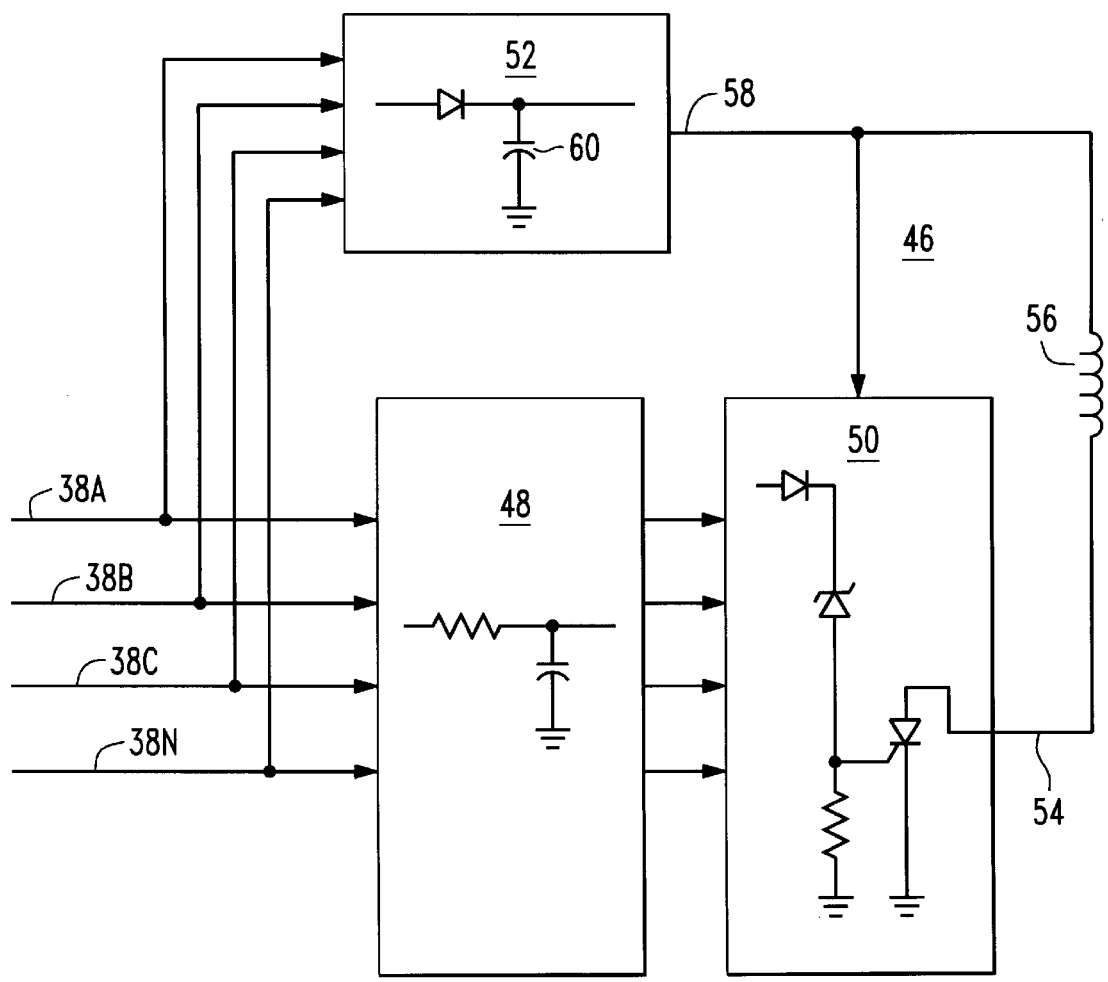
FIG. 5 is a block circuit diagram of an alternate embodiment for the trip electronics of this invention.

The stand-alone override trip unit is schematically shown in FIG. 5 and is a simple analog circuit module that contains a power supply 52, input current signal conditioners (integrators) 48, threshold detection circuitry 50, and an output drive signal 54 to the trip actuator 56. The power supply 52 is derived directly by rectifying and peak filtering the sensor input signals supplied through current channels 38A, B, C and G. Simple resistor-capacitor integrators 48 are used to condition the input signals; one per channel. The conditioned signals are detected by the threshold detecting circuitry 50, which can be a simple Zener diode arrangement as illustrated in FIG. 5 or a simple comparator circuit (that generates an output drive signal 54 to the trip actuator 56). Power to the threshold detecting circuitry is provided by the energy stored in the power supply filter capacitor 60. In its simplest form this circuit is not adjustable and the selection of override current level is accomplished by the selection of the override current sensor.

Thus, this invention provides additional flexibility and capability in providing various options that will enable circuit breakers to support higher frame ratings and to inexpensively adapt to different current rating requirements for various applications.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only, and not limiting as to the scope of the invention which is to be given the full breath of the claims appended and any and all equivalents thereof.

What is claimed is:

1. A circuit interrupter including:
   a first current sensor for monitoring current in a circuit over a range of values experienced by a load under normal operating conditions including overcurrent excursions not greater than a first preselected value, and providing a corresponding output;
   a second current sensor for monitoring current in the circuit above the normal operating range of the load, and providing a corresponding output;
   a processing circuit for monitoring the outputs of the first and second sensors, and responsive to a first sensor output representative of current excursion above a second preselected value for greater than a predetermined time interval to supply a first command signal to open the circuit; and responsive to a second sensor output above a third preselected value to supply a second command signal to open the circuit; and wherein the first preselected value is equal to or above the second preselected value and the third preselected value is greater than the first and second preselected values.

2. The circuit interrupter of claim 1 wherein the second command signal immediately opens the circuit.

3. The circuit interrupter of claim 1 wherein the third preselected value is approximately matched to a withstand rating of the circuit interrupter.

4. The circuit interrupter of claim 1 wherein the first sensor is a standard magnetic-core current transformer.

5. The circuit interrupter of claim 4 wherein the first sensor surrounds a current conductor that it monitors at a given location along the conductor.

6. The circuit interrupter of claim 4 wherein the second sensor is a wound coil with a low permeability core and is placed in proximity of a current conductor that it monitors.

7. The circuit interrupter of claim 6 wherein the second sensor is placed within the core of the first sensor between a portion of the first sensor and the conductor.

8. The circuit interrupter of claim 6 wherein the second current sensor is an air core current transformer.

9. The circuit interrupter of claim 4 which receives its operating power from the output of the first sensor.

10. The circuit interrupter of claim 9 wherein the output of the first current sensor is clamped not to substantially exceed the current limitations of the processing circuit.

11. The circuit interrupter of claim 10 wherein the core of the first sensor is designed to saturate magnetically at or below the current limitations of the processing circuit.

12. The current interrupter of claim 11 wherein the second preselected value is the pick up value.

13. The circuit interrupter of claim 12 wherein the second preselected value is adjusted to a new value by interchanging the first sensor with a new sensor designed to saturate at or slightly above the new value.

14. A circuit interrupter having a time withstand current rating, and a rapid, short response trip set point, including:
   a current sensor having negligible output within a normal current operating range for monitoring currents within a circuit above such range, and responsive to currents substantially above such range to provide a corresponding output; and
   a rapid response trip mechanism for monitoring the sensor output and opening the monitored circuit when the output identifies the monitored current is above the rapid, short response trip set point.

15. The circuit interrupter of claim 14 wherein the sensor is an electrical coil wound around a low permeability core.

16. The circuit interrupter of claim 15 wherein the short response trip set point is adjusted by interchanging the sensor with a new sensor that has a monitoring range corresponding to the adjusted short response trip set point.

17. The circuit interrupter of claim 14 wherein the current sensor and rapid response trip mechanism is packaged as an add-on auxiliary component.

18. The circuit interrupter of claim 14 including a delayed trip set point.

19. The circuit interrupter of claim 18 wherein the short response trip set point is substantially above the delayed trip set point.

20. The circuit interrupter of claim 19 wherein the output from the sensor powers the trip mechanism.

21. The circuit interrupter of claim 20 wherein the sensor has an air core.

22. The circuit interrupter of claim 21 wherein the short response trip set point is adjusted by interchanging the sensor with a new sensor that has a sufficient output at the adjusted short response trip set point to actuate the trip mechanism.

* * * * *